(12) United States Patent
Langhammer et al.

(10) Patent No.: US 11,334,318 B2
(45) Date of Patent: May 17, 2022

(54) PREFIX NETWORK-DIRECTED ADDITION

(71) Applicant: Intel Corporation, Santa Clara, CA (US)

(72) Inventors: Martin Langhammer, High Wycombe (GB); Bogdan Mihai Pasca, Toulouse (FR); Sergey Vladimirovich Gribok, Santa Clara, CA (US)

(73) Assignee: Intel Corporation, Santa Clara, CA (US)

( * ) Notice: Subject to any disclaimer, the term of this patent is extended or adjusted under 35 U.S.C. 154(b) by 778 days.

(21) Appl. No.: 16/052,336

(22) Filed: Aug. 1, 2018

(65) Prior Publication Data

US 2019/0042194 A1 Feb. 7, 2019

Related U.S. Application Data

(60) Provisional application No. 62/697,265, filed on Jul. 12, 2018.

(51) Int. Cl.
| | |
|---|---|
| *G06F 7/506* | (2006.01) |
| *G06F 7/505* | (2006.01) |
| *G06F 7/503* | (2006.01) |
| *G06F 17/16* | (2006.01) |
| *H03K 19/173* | (2006.01) |

(Continued)

(52) U.S. Cl.
CPC .............. *G06F 7/506* (2013.01); *G06F 7/503* (2013.01); *G06F 7/505* (2013.01); *G06F 17/16* (2013.01); *H03K 19/1737* (2013.01); *H03K 19/17724* (2013.01); *H03K 19/17744* (2013.01);

(Continued)

(58) Field of Classification Search
CPC ........ G06F 7/50–5095; G06F 9/30098–30134; G06F 2207/5063; G06F 2207/4812
See application file for complete search history.

(56) References Cited

U.S. PATENT DOCUMENTS 5,327,369 A * 7/1994 Ashkenazi ............. G06F 7/507
 708/274
5,477,480 A * 12/1995 Inui ......................... G06F 7/508
 708/711

(Continued)

OTHER PUBLICATIONS

Freiberger M. on "Maths in a minute: Truth tables". Retrieved on [Aug. 3, 2021]. Retrieved from the Internet <https://plus.maths.org/content/maths-minute-truth-tables> (Year: 2018).*

(Continued)

*Primary Examiner* — Emily E Larocque
*Assistant Examiner* — Carlo Waje
(74) *Attorney, Agent, or Firm* — Fletcher Yoder, P.C.

(57) ABSTRACT

The present disclosure relates generally to techniques for enhancing adders implemented on an integrated circuit. In particular, arithmetic performed by an adder implemented to receive operands having a first precision is restructured so that a set of sub-adders performs the arithmetic on a respective segment of the operands. More specifically, the adder is restructured, and a decoder determines a generate signal and a propagate signal for each of the sub-adders and routes the generate signal and the propagate signal to a prefix network. The prefix network determines respective carry bit(s), which carries into and/or select a sum at a subsequent sub-adder.

20 Claims, 13 Drawing Sheets

(51) Int. Cl.
*H03K 19/17724* (2020.01)
*H03K 19/17736* (2020.01)

(52) U.S. Cl.
CPC ............... *G06F 2207/4812* (2013.01); *G06F 2207/5063* (2013.01)

(56) References Cited

U.S. PATENT DOCUMENTS

| | | | | |
|---|---|---|---|---|
| 6,233,671 | B1* | 5/2001 | Abdallah | G06F 9/30014 |
| | | | | 712/210 |
| 6,539,413 | B1* | 3/2003 | Goldovsky | G06F 7/506 |
| | | | | 708/700 |
| 7,152,089 | B2* | 12/2006 | Harris | G06F 7/508 |
| | | | | 708/710 |
| 8,527,920 | B1* | 9/2013 | Choudhury | G06F 30/327 |
| | | | | 716/104 |
| 10,340,920 | B1* | 7/2019 | Langhammer | G06F 17/16 |
| 2002/0013800 | A1* | 1/2002 | Bhushan | G06F 7/4824 |
| | | | | 708/493 |
| 2003/0115237 | A1* | 6/2003 | Fletcher | G06F 7/508 |
| | | | | 708/711 |
| 2003/0145033 | A1* | 7/2003 | Bradley | G06F 7/508 |
| | | | | 708/710 |
| 2004/0073593 | A1* | 4/2004 | Wen | G06F 7/508 |
| | | | | 708/710 |
| 2004/0128339 | A1* | 7/2004 | Kalampoukas | G06F 7/727 |
| | | | | 708/706 |
| 2004/0225706 | A1* | 11/2004 | Harris | G06F 7/74 |
| | | | | 708/671 |
| 2021/0124558 | A1* | 4/2021 | Elkin | G06F 9/3001 |

OTHER PUBLICATIONS

Zimmermann R. on "Binary Adder Architectures for Cell-Based VLSI and their Synthesis". Retrieved on [Jul. 28, 2021]. Retrieved from the Internet <https://citeseerx.ist.psu.edu/viewdoc/download?doi=10.1.1.68.9657&rep=rep1&type=pdf> (Year: 1997).*

Chen K. on "Parallel Adders" Lecture Notes. Retrieved on [Jul. 28, 2021]. Retrieved on the Internet <http://users.encs.concordia.ca/~asim/COEN_6501/Lecture_Notes/L2_Notes.pdf> (Year: 2005).*

F. de Dinechin, H. D. Nguyen and B. Pasca, "Pipelined FPGA Adders," 2010 International Conference on Field Programmable Logic and Applications, 2010, pp. 422-427, doi: 10.1109/FPL.2010.87. (Year: 2010).*

M. Langhammer, B. Pasca and G. Baeckler, "High Precision, High Performance FPGA Adders," 2019 IEEE 27th Annual International Symposium on Field-Programmable Custom Computing Machines (FCCM), 2019, pp. 298-306, doi: 10.1109/FCCM.2019.00047. (Year: 2019).*

Bogdan Mihai Pasca. High-performance floating-point computing on reconfigurable circuits. Other [cs.OH]. Ecole normale superieure de lyon—ENS LYON, 2011. English.

U.S. Appl. No. 15/933,057, filed Mar. 22, 2018, Martin Langhammer.

U.S. Appl. No. 15/937,347, filed Mar. 27, 2018, Martin Langhammer.

Rogawski, Marcin et al., A Novel Modular Adder for One Thousand Bits and More Using Fast Carry Chains of Modern FPGAs, 2014 24th International Conference on Field Programmable Logic and Applications (FPL), Sep. 2, 2014, p. 1-8, IEEE, Munich, Germany.

* cited by examiner

| GENERATE | PROPAGATE' | PROPAGATE |
|---|---|---|
| 0 | 0 | 0 |
| 1 | 0 | 0 |
| 0 | 1 | 1 |
| 1 | 1 | 0 |

PREFIX NETWORK-DIRECTED ADDITION

CROSS REFERENCE TO RELATED APPLICATIONS

This application claims priority from and benefit of U.S. Provisional Application Ser. No. 62/697,265, filed Jul. 12, 2018, entitled "Multi-Input Reduction Structure for Very Large Integers," which is hereby incorporated by reference in its entirety for all purposes.

BACKGROUND

The present disclosure relates generally to integrated circuits, such as field-programmable gate arrays (FPGAs). More particularly, the present disclosure relates to adder circuitry to perform large arithmetic operations implemented using circuitry elements of an integrated circuit (e.g., programmable logic of an FPGA).

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Integrated circuits increasingly carry out functions, such as encryption, that have become essential to everyday life. Indeed, encryption is becoming increasingly valuable in a number of technical fields, such as financial transaction security. Encryption (as well as many other operations that may take place on an integrated circuitry, such as certain multiplication operations) may use increasingly large precision arithmetic that, in some cases, may involve a final addition operation to sum operands having a large precision. In some cases, for example, the precision of the operands may be on the order of thousands of bits. The final addition operation may be carried out by a final adder circuit. However, since the final adder circuit may include smaller adder circuits chained together to accommodate the large precision arithmetic involved with summing the operands, the final adder circuit may represent a critical path for an encryption and/or multiplication operation implemented on an integrated circuit. In fact, the final adder may consume a relatively large area of the integrated circuit, consume a relatively large amount of power, and/or produce additional latency in the integrated circuit.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
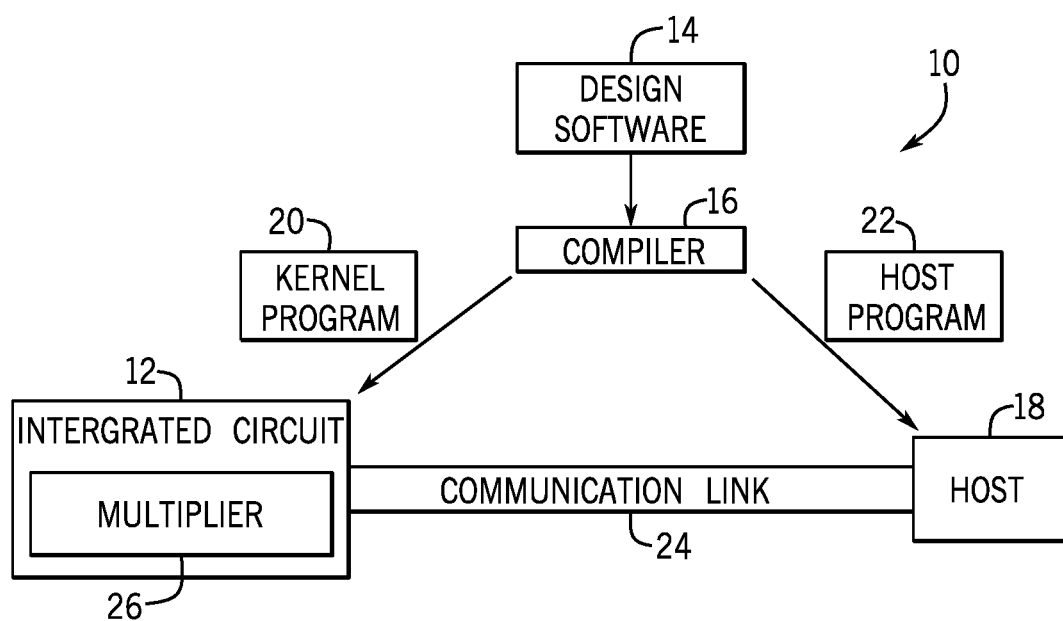
FIG. 1 is a block diagram of a system for implementing arithmetic operations, in accordance with an embodiment.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions may be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Further, it is noted that, as referred to in the disclosure, the term "ripple carry adder" generally refers to an adder circuit structure implemented so that the carry-out of a full adder is fed (e.g., rippled) into the carry-in position of a subsequent, more significant full adder of the ripple carry adder. As additionally referred to in the disclosure, the term "carry propagate adder" may refer to an adder circuit that may be constructed from multiple smaller adder circuits, such as ripple carry adders.

As discussed in further detail below, embodiments of the present disclosure relate generally to reducing the area of an integrated circuit consumed by and/or the latency resulting from an adder circuit. More specifically, the present disclosure relates to more efficient mapping of adders suitable to perform large arithmetic operations, such as a final adder used to perform a multiplication operation, to programmable logic. In some cases, a carry propagate adder circuit, such as the final adder used to perform a multiplication, may be implemented with ripple carry adders. Further, to construct a carry propagate adder with a suitable precision and/or to fit the carry propagate adder onto an integrated circuit, a set of adders having smaller precisions (e.g., sub-adder circuits) may be chained and/or pipelined together, and the input and/or output datapaths associated with each of the set of sub-adders chained and/or pipelined together may be delay balanced with one another. As delay balancing may use significant registers and/or memory, the carry propagate adder may result in significant area, latency, and/or power concerns on an integrated circuit Accordingly, to reduce the area, power, and/or latency involved with implementing the adder to programmable logic, the adder may be restructured so that the set of sub-adders are not chained and/or pipelined together (e.g., dependent on the latency of one another). As will be discussed in further detail below, restructuring the adder may involve routing a generate and a propagate signal determined at a decoder circuit for each of the set of sub-adders to a prefix network circuit implemented to produce a suitable carry bit to carry into a subsequent sub-adder in the set of sub-adders. Restructuring the adder may further involve pipelining a sum of segments of a pair of operands (e.g., operand segments) received at the adder from a sub-adder implemented in the decoder to a sub-adder implemented to receive the carry out bit from the prefix network as a carry in bit. Further, in some embodiments, the prefix network of the restructured adder may be implemented as a recursive implementation of the restructured adder itself. Additionally or alternatively, the decoder of the restructured adder may be restructured to use a multi-input AND gate and/or to compress the summation of the operand segments. Moreover, restructuring the adder may include any suitable combination of the techniques described above.

With the foregoing in mind, FIG. 1 illustrates a block diagram of a system 10 that may implement arithmetic operations. A designer may desire to implement functionality, such as the large precision arithmetic operations of this disclosure, on an integrated circuit device 12 (such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit device 12 without specific knowledge of low-level hardware description languages (e.g., Verilog or VHDL). For example, because OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designers may implement their high-level designs using design software 14, such as a version of Intel® Quartus® by INTEL CORPORATION. The design software 14 may use a compiler 16 to convert the high-level program into a lower-level description. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a multiplier 26 on the integrated circuit device 12. The multiplier 26 may include circuitry and/or other logic elements and may be configured to implement, for example, encryption and/or arithmetic operations.

While the techniques described herein relate to the application of a high-level program, in some embodiments, the designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
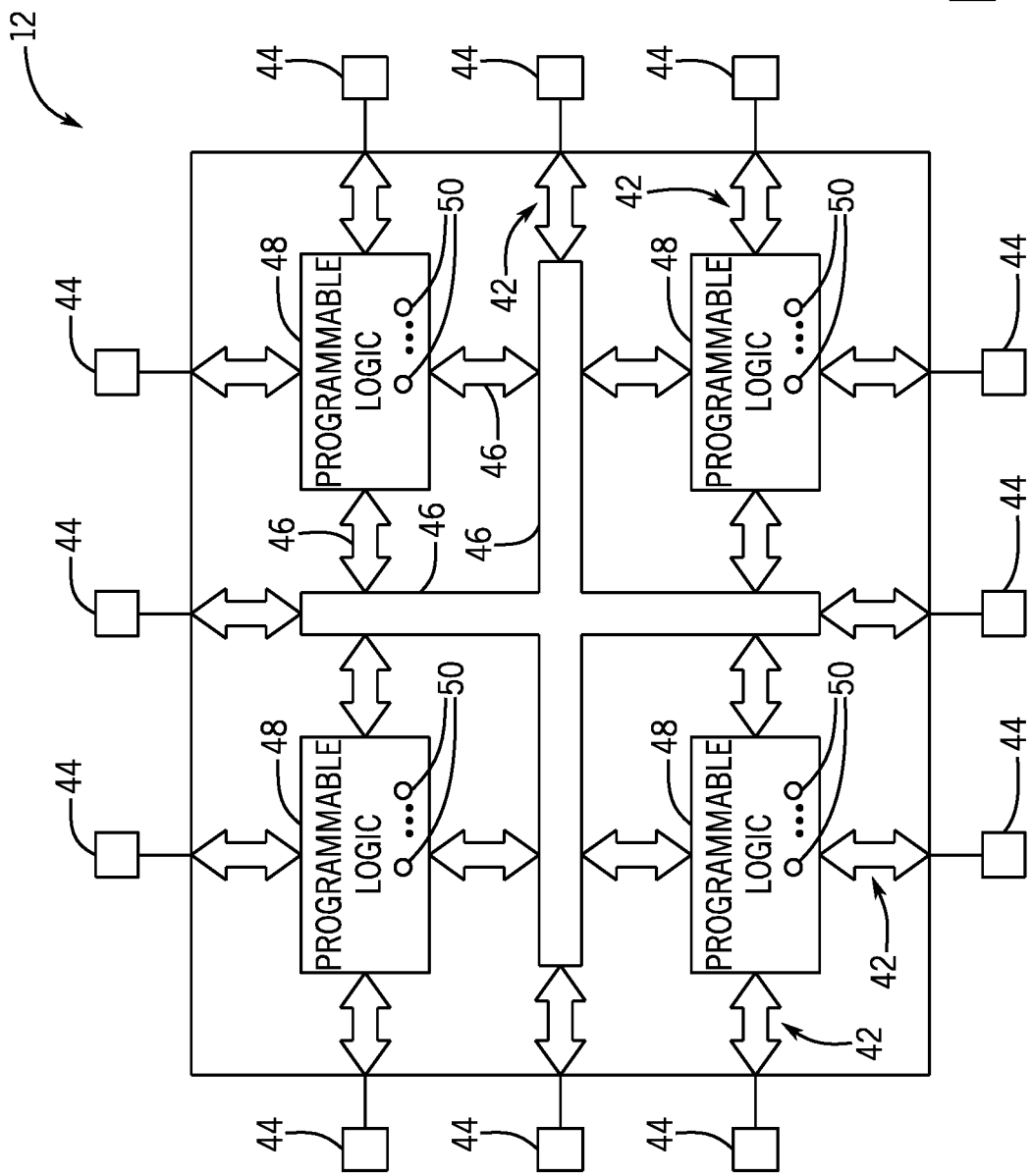
FIG. 2 is a block diagram of an integrated circuit where adders may be implemented, in accordance with an embodiment.

Turning now to a more detailed discussion of the integrated circuit device 12, FIG. 2 illustrates an example of the integrated circuit device 12 as a programmable logic device, such as a field-programmable gate array (FPGA). Further, it should be understood that the integrated circuit device 12 may be any other suitable type of programmable logic device (e.g., an application-specific integrated circuit and/or application-specific standard product). As shown, integrated circuit device 12 may have input/output circuitry 42 for driving signals off device and for receiving signals from other devices via input/output pins 44. Interconnection resources 46, such as global and local vertical and horizontal conductive lines and buses, may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as integrated circuit device 12, may contain programmable elements 50 with the programmable logic 48. For example, as discussed above, a designer (e.g., a customer) may program (e.g., configure) the programmable logic 48 to perform one or more desired functions. By way of example, some programmable logic devices may be programmed by configuring their programmable elements 50 using mask programming arrangements, which is performed during semiconductor manufacturing. Other programmable logic devices are configured after semiconductor fabrication operations have been completed, such as by using electrical programming or laser programming to program their programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, because these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
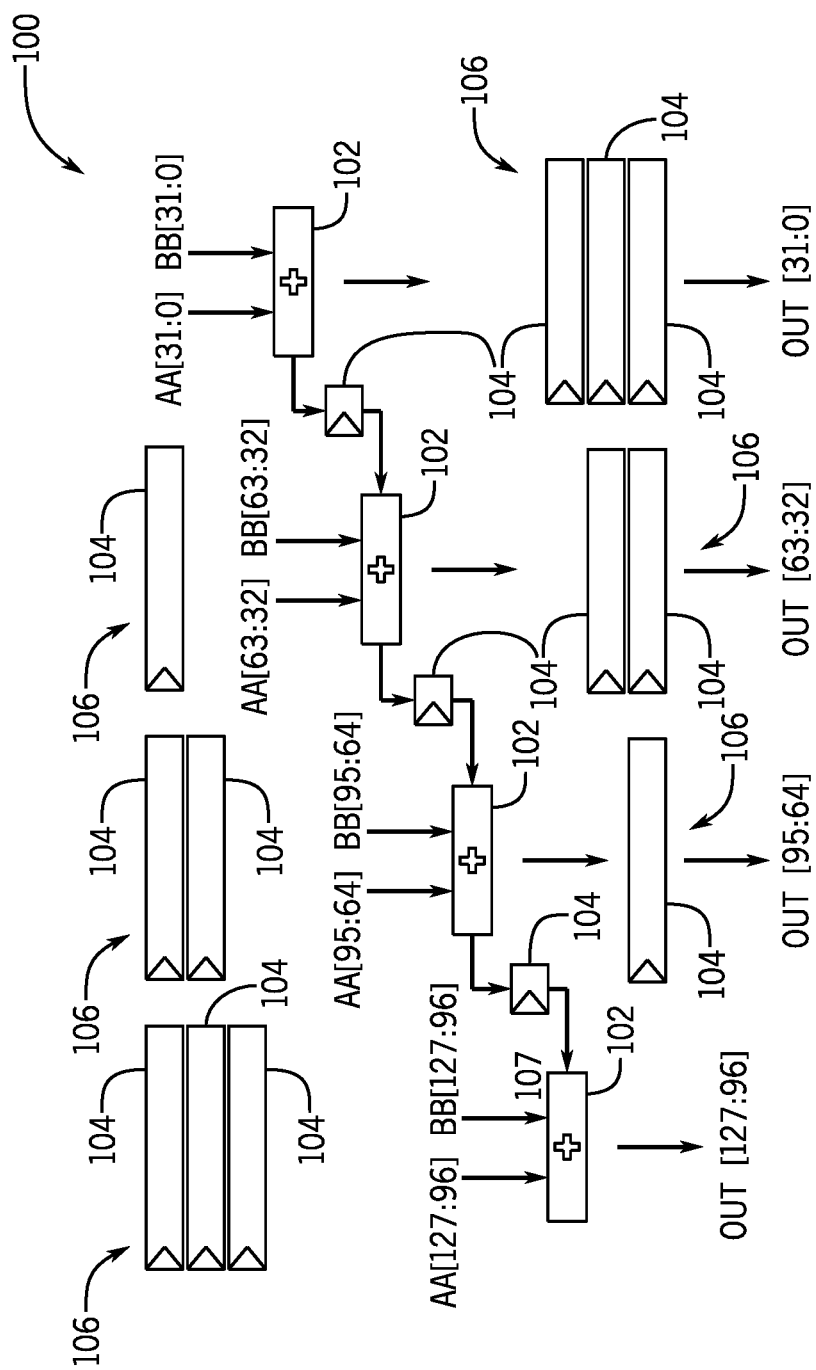
FIG. 3 is a block diagram of a pipelined adder, in accordance with an embodiment.

Turning now to FIG. 3, a pipelined adder 100 (e.g., adder circuitry), such as a carry propagate adder (CPA), which may handle the summation of large operands by decomposing the operands into smaller segments, is illustrated. In the illustrated embodiment, the pipelined adder 100 receives two, 128-bit operands, AA[127:0] and BB[127:0], which are each separated into four, 32-bit segments (e.g., AA[31:0], AA[63:32], AA[95:64], and AA[127:96] and BB[31:0], BB[63:32], BB[95:64], and BB[127:96], respectively). By separating the two 128-bit operands into smaller (e.g., 32-bit) segments (e.g., operand segments), the sum of the two 128-bit operands may be determined with a set of four 32-bit sub-adders 102, which may be implemented as ripple carry adders, that are pipelined together. Thus, as illustrated in FIG. 3, a first sub-adder 102 may sum AA[31:0] and BB[31:0], a second sub-adder 102 may sum AA[63:32] and BB[63:32] with a first carry-in value received from the first sub-adder 102, a third sub-adder 102 may sum AA[95:64] and BB[95:64] with a second carry-in value received from the second sub-adder 102, and a fourth sub-adder 102 may sum AA[127:96] and BB[127:96] with a third carry-in value received from the third sub-adder 102.

To use the first carry-in value during the summation of AA[63:32] and BB[63:32], the operand segments AA[63:32] and BB[63:32] input to the second sub-adder 102 may be delayed by one or more clock cycles to arrive concurrently with the first carry-in value. For example, because the result (e.g., the carry-out) of the addition of AA[31:0] and BB[31:0] is used as the first carry-in value in the summation of AA[63:32] and BB[63:32], the summation of AA[63:32] and BB[63:32] may be delayed until the carry-out from the first sub-adder 102, which may be stored in a register 104, is available. In some embodiments, to delay the operand segments AA[63:32] and BB[63:32], the pipelined adder 100 may route the operand segments AA[63:32] and BB[63:32] through a first delay chain 106, which may be implemented with one or more registers 104, memory, a first-in-first-out (FIFO) data structure, and/or the like, prior to receiving the operand segments AA[63:32] and BB[63:32] at the second sub-adder 102. Further, to suitably delay the operand segments AA[95:64] and BB[95:64], the pipelined adder 100 may route the operand segments AA[95:64] and BB[95:64] through a second delay chain 106, which, in some embodiments, may delay the operand segments AA[95:64] and BB[95:64] from arriving at the third sub-adder 102 for two or more clock cycles so that the operand segments AA[95:64] and BB[95:64] are available at the third sub-adder 102 concurrently with the second carry-in value received from the second sub-adder 102. Accordingly, the pipelined adder 100 may include a third delay chain 106 to delay the operand segments AA[127:96] and BB[127:96] three or more clock cycles prior to their arrival at the fourth sub-adder 102 so that the operand segments AA[127:96] and BB[127:96] are concurrently available with the third carry-in value received from the third sub-adder 102.

Further, by concatenating the output of the first 32-bit adder 102 with the outputs of the second sub-adder 102, the third sub-adder 102, and the fourth sub-adder 102, the 128-bit sum of AA[127:0] and BB[127:0] may be formed. Since the first sub-adder 102 may calculate and output the sum of the operand segments AA[31:0] and BB[31:0] before any of the other sub-adders 102 (e.g., the second sub-adder 102, the third sub-adder 102, and the fourth sub-adder 102), the pipelined adder 100 may be implemented to route the output of the first sub-adder 102 through a fourth delay chain 106. The fourth delay chain may delay the output of the first sub-adder 102 a number of clock cycles that may be dependent on the number of sub-adders 102 following the first sub-adder 102 in the pipelined adder 100. Accordingly, in the illustrated embodiment, the fourth delay chain 106 may delay the output of the first sub-adder 102 three clock cycles, but in other embodiments, the fourth delay chain 106 may be implemented to delay the output of the first sub-adder 102 a greater or fewer number of clock cycles. Further, the pipelined adder 100 may route the output of the second sub-adder 102 through a fifth delay chain 106 and the output of the third sub-adder 102 through a sixth delay chain 106 so that the outputs of each of the sub-adders 102 are available concurrently.

While the techniques described above reference a 128-bit pipelined adder 100, which includes four, 32-bit sub-adders 102 pipelined together, in some embodiments, pipelined adder 100 may be implemented with larger precision, such as a 1024-bit pipelined adder 100 and/or another suitable size. In such cases, the pipelined adder 100 may be decomposed into a greater number of sub-adders 102, such as 32, 32-bit sub-adders 102. Further, the delay chains 106 may be implemented to increase the latency (e.g., delay) before inputs to and/or outputs from a sub-adder 102 are made available. Additionally or alternatively, the precision of the operand segments and/or the sub-adders 102 may be increased or decreased, and in some embodiments, the precision of the operand segments and/or the sub-adders 100 may be determined based in part on the precision of the integrated circuit device 12. In any case, examples described herein are intended to be illustrative, and not limiting.

In some embodiments, the delay chains 106 of the pipelined adder 100 may use significant resources in the integrated circuit device 12, as the delay chains 106 may occupy a significant area in the integrated circuit device 12 and/or consume significant power in the integrated circuit device 12. Further, because each sub-adder 102 of the pipelined adder 100 is arithmetically connected to the previous sub-adder 102 in the pipelined adder 100 (e.g., the second sub-adder 102 is arithmetically dependent on the first sub-adder 102), integrated circuit device 12 may fit the pipelined adder 100 in a contiguous area of the integrated circuit device 12, which may limit and/or restrict the use of available area in the integrated circuit device 12. Moreover, because the sub-adders 102 are not independent, addition performed by the pipelined adder 100 may incur significant latencies to suitably delay input operand segments and outputs of the sub-adders 102.

Figures 4, 5:
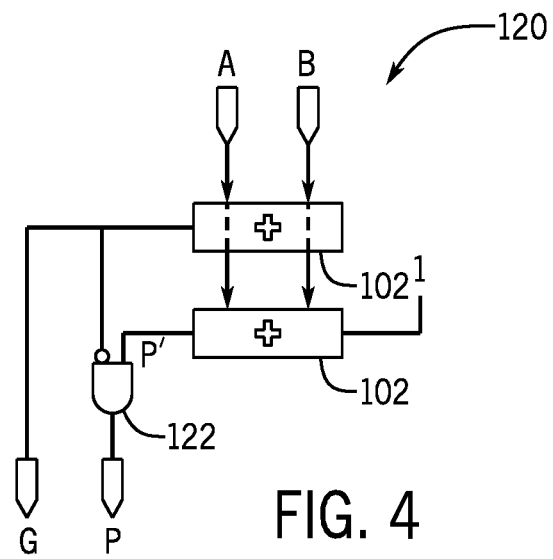
FIG. 4 is a block diagram of a decoder circuit, in accordance with an embodiment.
FIG. 5 is a table mapping generate signal values and a precursor to a propagate signal (e.g., a propagate' signal) values produced by the decoder of FIG. 4 to a resulting propagate signal value, in accordance with an embodiment.

Accordingly, as illustrated in FIG. 4, a decoder 120 may be implemented to decode a generate signal (G) and/or a propagate signal (P) from an independent sub-adder 102. In some embodiments, as described in greater detail below, a restructured adder may use the generate signal and/or propagate signal to determine the sum of two operand segments (e.g., AA[31:0] and BB[31:0]) at a sub-adder independently from the output and/or carry-in value generated by another sub-adder 102.

To decode the generate signal, the decoder 120 may, using a sub-adder 102, determine a carry-out signal resulting from the sum of a first operand segment (A) and a second operand segment (B). In some embodiments, the decoder 120 may directly route the generate signal (e.g., carry-out signal) from the carry chain of a sub-adder 102 of the decoder 120. Additionally or alternatively, the decoder 120 may output the generate signal from logic by, for example, zero extending the most significant bit of the sub-adder 102. The decoder 120 may route the resulting generate signal to a logical AND gate 122, which may use the complement of the generate signal to generate the propagate signal. For example, the logical AND gate 122 of the decoder may receive the complement of the generate signal and a propagate' signal (P') (e.g., a precursor to the propagate signal), which may be generated by an additional sub-adder 102 implemented to sum the first operand segment and the second operand segment with a carry-in value of 1, as inputs and may determine the logical AND of these inputs (NOT (G) AND P') to generate the propagate signal (P).

Turning now to FIG. 5, a table 140 illustrates the value of the propagate signal resulting from combinations of generate signal and propagate signal' values. Accordingly, the decoder 120 may output a propagate signal having a value of 1 when the generate signal has a value of 0 (e.g., is not generated) and the propagate' signal has a value of 1 and may output a propagate signal having a value of 0 for any other combination of generate signal and propagate signal values.

Figure 6:
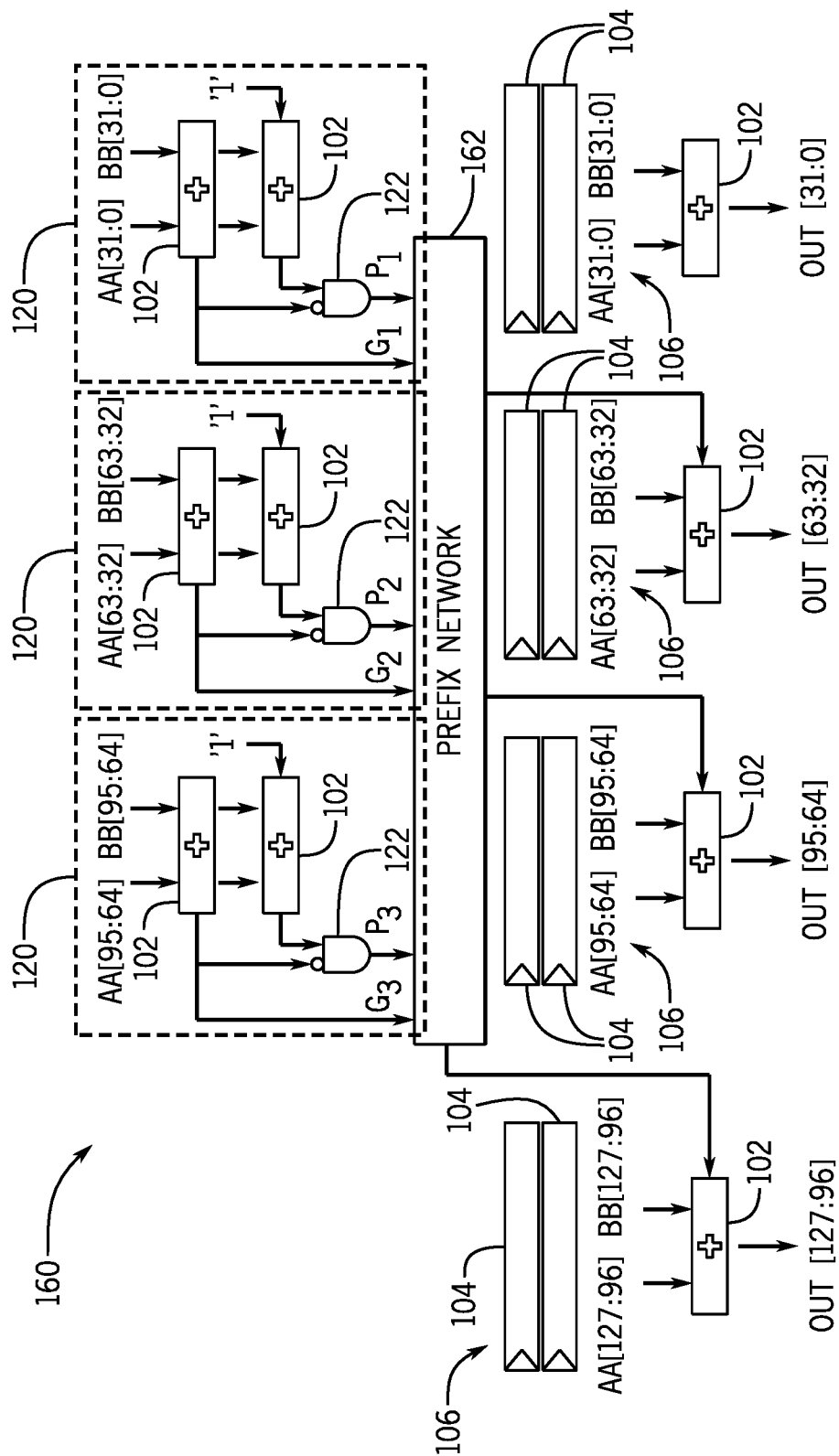
FIG. 6 is a block diagram of a restructured adder, in accordance with an embodiment.

As discussed above, a restructured adder may use the generate signal and propagate signal to determine one or more sums at one or more sub-adders 102 independent of the outputs of one or more additional sub-adders 102. Accordingly, FIG. 6 illustrates a restructured adder 160 (e.g., adder circuitry) implemented to use a decoder 120 and a prefix network 162 to determine the sum of two operands. More specifically, using the decoder 120 and the prefix network 162, the restructured adder 160 may determine the sum of two operands, each having a first precision, based in part on the sum of corresponding pairs of segments of the two operands (e.g., pairs of operand segments), each having a second precision, which may be a smaller precision than the first precision.

As shown in the illustrated embodiment, the restructured adder 160 may include a decoder 120 for each pair of operand segments. For example, the restructured adder 160 may include a first decoder 120 implemented to decode a generate signal and/or a propagate signal resulting from a first pair of operand segments AA[31:0] and BB[31:0] (e.g., G1 and P1, respectively), a second decoder implemented to decode a generate signal and/or a propagate signal resulting from a second pair of operand segments AA[63:32] and BB[63:32] (e.g., G2 and P2, respectively), and a third decoder implemented to decode a generate signal and/or a propagate signal resulting from a third pair of operand segments AA[95:64] and BB[95:64] (e.g., G3 and P3, respectively). While not shown, each of the first pair of operand segments, the second pair of operand segments, and the third pair of operand segments may route from first input circuitry and second input circuitry of the restructured adder 160 implemented to receive the first operand (AA) and the second operand (BB), respectively. Further, as discussed above, the generate signal and propagate signal decoded at each decoder 120 are generated independently from the other generate and propagate signals and from the value of the other pairs of operand segments. Accordingly, the decoders 120 and/or the operand segments input to a respective decoder 120 may be placed on the integrated circuit device 12 in areas separate and remote from one another instead of within a contiguous area. As such, in some embodiments, fitting the restructured adder 160 onto the integrated circuit device 12 may be less cumbersome than fitting the pipelined adder 100.

The generate signal and propagate signal from each decoder 120 may feed into the prefix network 162, such as a soft logic prefix network. The prefix network 162 may be constructed out of combinatorial logic (e.g., combinatorial circuitry) and the layout of the prefix network 162 may be flexible. Accordingly, in some embodiments, the prefix network 162 may be implemented with a Kogge-Stone topology, a Brent-Kung topology, a Sklansky topology, a pipelined topology, and/or any other suitable topology. In any case, the prefix network 162 may be implemented to receive the generate signal and the propagate signal from a decoder 120 as inputs and to generate a carry bit based on the received generate signal and the received propagate signal. The restructured adder 160 may feed the generated carry bit into an input of a sub-adder 102 implemented to sum the pair of operand segments following (e.g., having an immediately more significant bit position) the pair of operand segments input to the decoder 120 responsible for producing the generate signal and the propagate signal corresponding to the carry bit. For example, the prefix network 162 may generate the respective carry-out bit corresponding to each of the summations performed by the sub-adders 102 and may route the carry-out bit to the carry-in position of a respective subsequent sub-adder 102. Accordingly, the restructured adder 160 may mimic the carry-chain used by the pipelined adder 100 to feed each carry-out bit from a preceding sub-adder 102 to a following sub-adder 102 using the prefix network 162. Further, as discussed above, by replacing the carry-chain with the prefix network 162 and the decoders 120, the restructured adder 160 may be used to generate sums of pairs of operand segments independently of one another. Accordingly, a decoder 120 and/or a sub-adder 102 may be fit onto integrated circuit device 12 separately from an additional decoder 120 and/or sub-adder, which may reduce the area of the integrated circuit device 12 used to perform summations.

In some embodiments, to ensure a pair of operand segments are available at a final sub-adder 102 of the restructured adder 160 concurrently with the corresponding carry-out bit generated by the prefix network 162, the restructured adder 160 may include a delay chain 106 implemented to delay the pair of operand segments a suitable number of clock cycles to compensate for any pipelining implemented in the topology of the prefix network 162. In such embodiments, each of the delay chains 106 included in the restructured adder 160 may implement the same delay (e.g., the same number of clock cycles). Further, because the addition of the least significant pair of operand segments (e.g., AA[31:0] and BB[31:0]) does not include a carry-in, the sum of the least significant pair of operand segments may be implemented by delaying production of the least significant generate signal.

Although the restructured adder 160 may appear more complex than the pipelined adder 100, the depth (e.g., number of stages and/or latency) of the restructured adder 160 may remain relatively constant, regardless of the precision of the restructured adder 160. For example, a restructured adder 160 with a precision of 1024-bits may include a wider (e.g., higher precision) prefix network 162 than the illustrated embodiment of the restructured adder 160, which has a precision of 128-bits, but because the prefix network 162 may be constructed with combinatorial logic, increasing the width (e.g., precision) of the prefix network 162 may not increase the depth and/or the latency of the restructured adder 160. Accordingly, the depth of the delay chains 106 used at the output of the prefix network 162 may remain the same between the restructured adder 160 with the precision of 1024-bits and the illustrated restructured adder 160. The depth of the pipelined adder 100, on the other hand, may increase by 1 with each additional sub-adder 102 used to sum each additional pair of operand segments, as the pipelined adder 100 may include an additional stage of pipelining (e.g., carry chain). Accordingly, the latency produced by the delay chains 106 of the pipelined adder 100 may increase as the precision of the pipelined adder 100 increases.

Figure 7:
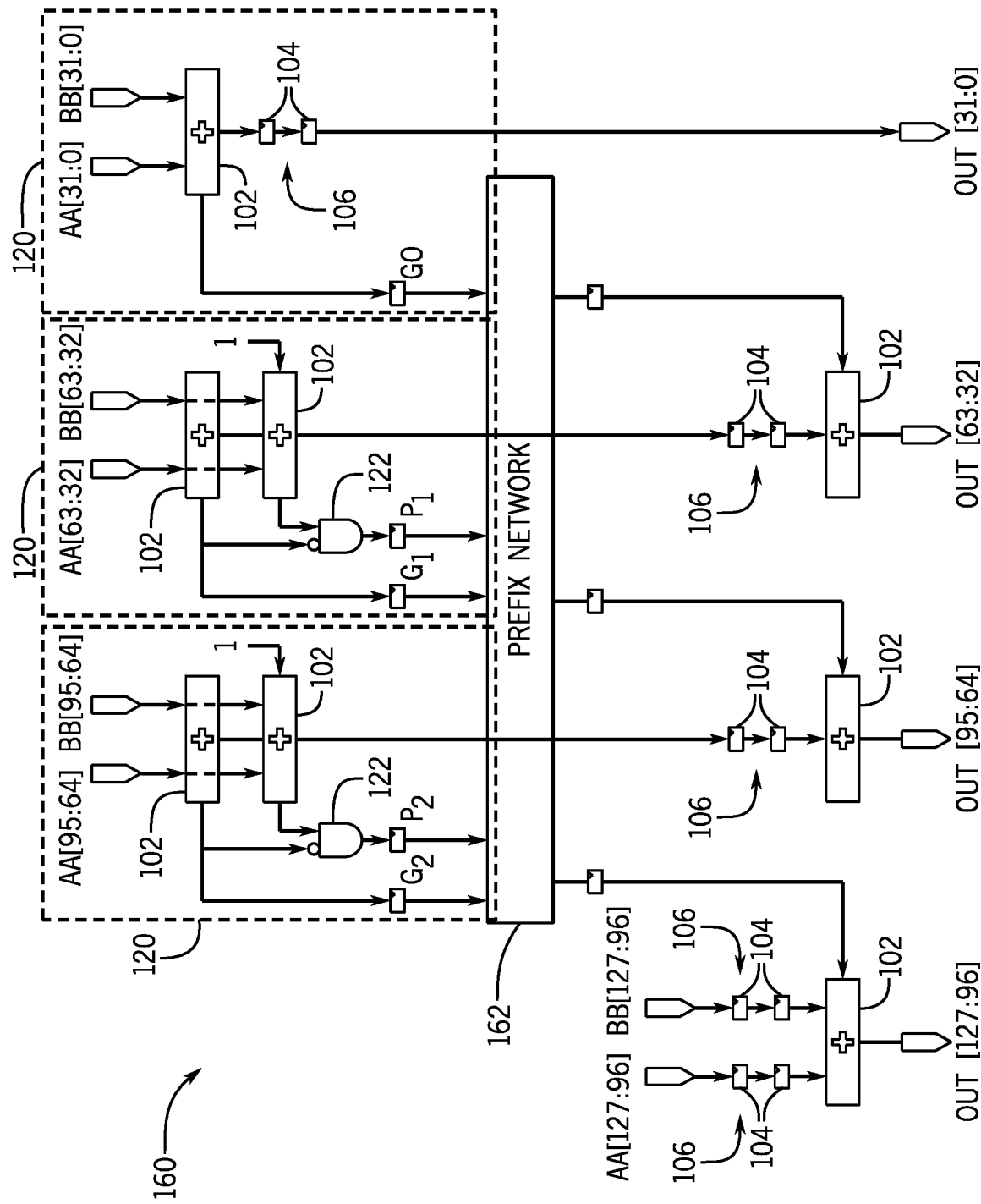
FIG. 7 is a block diagram of a pipelined restructured adder, in accordance with an embodiment.

Turning now to FIG. 7, the delay chains 106 of the restructured adder 160 may be placed in any suitable portion of the restructured adder 160. Accordingly, in some embodiments, instead of or in addition to pipelining (e.g., delaying) pairs of operand segments prior to routing them into the final sub-adder 102, the restructured adder 160 may be implemented to reuse the sums of the pairs of operand segments determined at the first sub-adder 102 at the final sub-adder 102. For example, the restructured adder 160 may route the sum generated by the first sub-adder 102 to bypass the prefix network 162 and serve as an input, along with the carry-in value determined by the prefix network 162, to the final sub-adder 102. As such, the final sub-adder may add the sum generated by the first sub-adder 102 with the carry-in value to generate the output segment.

By reusing the sum generated by the first sub-adder 102, the restructured adder 160 of FIG. 7 may reduce the area used by the restructured adder 160 of FIG. 7 to pipeline the pairs of operand segments into the final sub-adder. Accordingly, in some embodiments, the restructured adder 160 of FIG. 7 may fit more readily onto the integrated circuit device 12 than the restructured adder 160 of FIG. 6.

Figure 8:
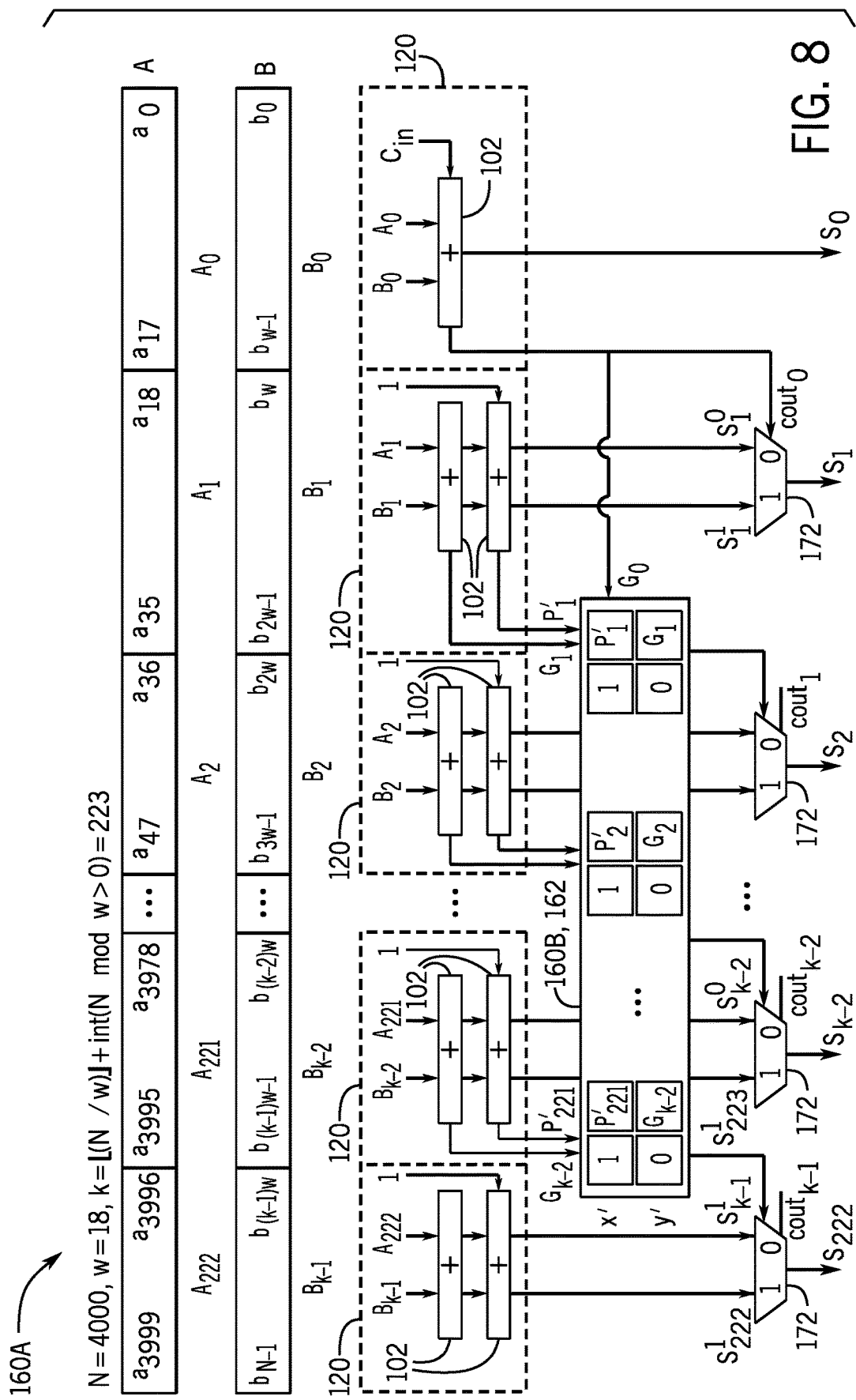
FIG. 8 is a block diagram of a top-level restructured adder having a recursive restructured adder implementation of a prefix network, in accordance with an embodiment.

Turning now to FIG. 8, in some embodiments, the propagate' signal may feed into the prefix network 162 in place of the propagate signal generated in FIG. 6. In such embodiments, for each pair of operand segments input to the restructured adder 160, the respective decoders 120 may calculate the sum of the pair of operand segments, which may be expressed as $S_i^0 = A_i + B_i$ for $i >= 1$ and may, except for in the case of the last (e.g., most significant) pair of operand segments, produce the generate signal $G_i$. The respective decoders 120 may additionally calculate the sum of the pair of operand segments with a carry-in value of 1, which may be expressed as $S_i^1 = A_i + B_i + 1$ for $i >= 1$ and may, except for in the case of the last pair of operand segments, produce the propagate' signal $P'_i$. For the first (e.g., least significant) pair of operand segments (e.g., =0) a sub-adder 102 may calculate the generate signal, which may be expressed as $S_0^{cin} = A_0 + B_0 + cin$.

In some embodiments, the prefix network 162 may generate a carry-out bit suitable to select between the sum of the pair of operand segments and the sum of the pair of operand segments with the carry-in value of 1. Accordingly, the restructured adder 160 may include a multiplexer 172 (mux) corresponding to each pair of operand segments that may output either the sum of the pair of operand segments or the sum of the pair of operand segments with the carry-in value of 1 based on the value of the carry-out bit received as a select signal at the mux 172 from the prefix network 162. Additionally or alternatively, as described in FIG. 6, the carry-out bit may carry-in to the sum of the pair of the operand segments.

To generate the carry-out bit to be used as a select signal and/or a carry-in, the prefix network 162 may receive a first input string (X), which may include alternating $P'_i$ and is as depicted for $i >= 1$ and up to, but excluding the last pair of operand segments, and a second input string (Y), which may include alternating $G_i$ and 0s for $i >= 1$ and up to, but excluding the last pair of operand segments. The sum of the first input string and the second input string (e.g., X+Y) may contain the negated carry-out, which may be used by the restructured adder 160 as the carry-out bit of the prefix network 162, corresponding to the preceding pair of operand segments on the odd indices of the sum (e.g., on the sum bits corresponding to the bit positions of the alternating 0s and 1s in the first input string and the second input string, respectively).

Further, in some embodiments, if the size (e.g., bit-width) of the first input string and the second input string is less than or equal to the bit-width of an operand segment (e.g., the precision of the sub-adder 102), then the restructured adder 160 may sum the first input string and the second input string using a 1-cycle ripple carry adder (not shown), which may be implemented as the prefix network 162. However, if the size of the first input string and the second input string is greater than the bit-width of the operand segment, then the implementation of the prefix network 162 as a ripple-carry adder may result in a decreased circuit frequency. Accordingly, as described in greater detail below, in such embodiments, an alternate prefix network 162 topology may be implemented to improve the circuit frequency resulting from the addition of the first input string and the second input string.

While the prefix network 162 is described above as having a topology, such as the Kogge-Stone topology, the Brent-Kung topology, the Sklansky topology, and/or the like, in some embodiments, a recursive implementation of the restructured adder 160 may be used to implement the prefix network 162 in a restructured adder 160. As an illustrative example, the recursive implementation of the restructured adder 160 as a prefix network 162 is described below in FIGS. 8-11 in the context of two 4000-bit operands (e.g., A and B) received as inputs to the top-level restructured adder 160A. In some embodiments, however, the techniques may be extended for use in any suitably sized restructured adder 160 and/or prefix network 162. That is, examples described herein are intended to be illustrative, and not limiting.

To segment a 4000-bit operand into 18-bit operand segments, the top-level restructured adder 160A may include 223 operand segments, which may be calculated by the equation $$k = \lfloor N/w \rfloor + \text{int}(N \% w > 0),$$

where k represents the number of operand segments, N represents the bit-width of the operands, and w represents the bit-width of the operand segments (e.g., the bit-width of the sub-adders 102). In such cases, the first input string (X) and the second input string (Y) may each have a bit-width of 442 to include an alternating 1 or 0 along with the propagate' signal or generate signal, respectively for each pair of operand segments except the most significant and the least significant operand segments. For example, the bit-width of the first input string and the second input string may be determined by subtracting 2 from the number of operand segments (223) and multiplying this result by 2 (e.g., (223−2)*2).

Figure 9:
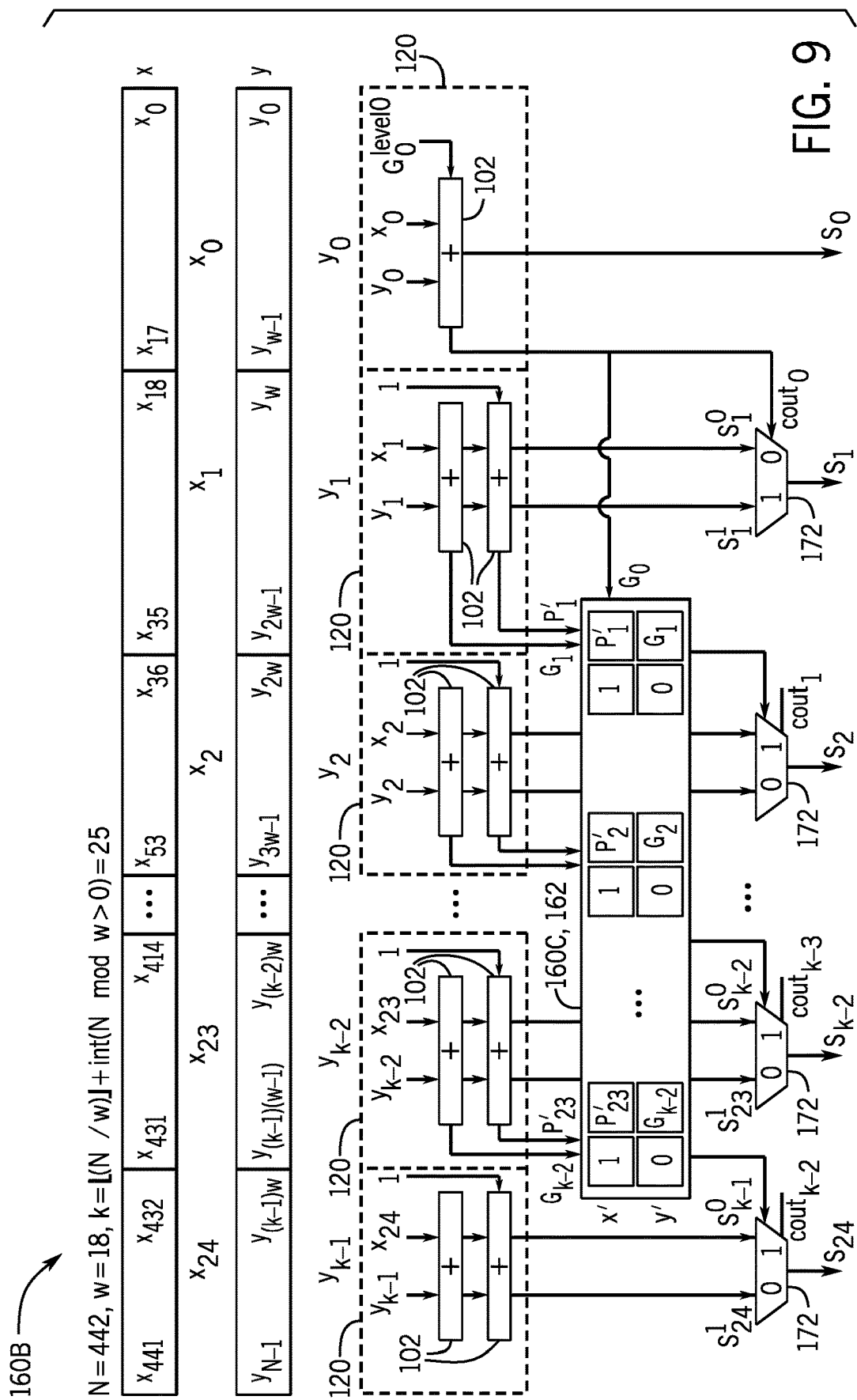
FIG. 9 is a block diagram of a first mid-level restructured adder having a recursive restructured adder implementation of a prefix network, in accordance with an embodiment.

Accordingly, the prefix network 162 of the top-level restructured adder may have a precision of 442. More specifically, in some embodiments, the top-level restructured adder 160A may route the first input string and the second input string to a first mid-level restructured adder 160B implemented to receive operands with a bit-width of 442. Turning to FIG. 9, the first mid-level restructured adder 160B may segment the first input string and the second input string into 25, 18-bit operand segments. Accordingly, the first mid-level restructured adder 160B may route a first mid-level first input string (X'), which may be formed by alternating 1s between the propagate' signal values generated by the decoders 120 implemented to sum the first input string (X) and the second input string (Y) with a carry-in of 1, and a first mid-level second input string (Y'), which may be formed by alternating 0s between the generate signal values generated by the decoders 120 implemented to sum the first input string (X) and the second input string (Y). To that end, the prefix network 162 of the first mid-level restructured adder 160B may receive two 46-bit input strings (e.g., X' and Y').

Figure 10:
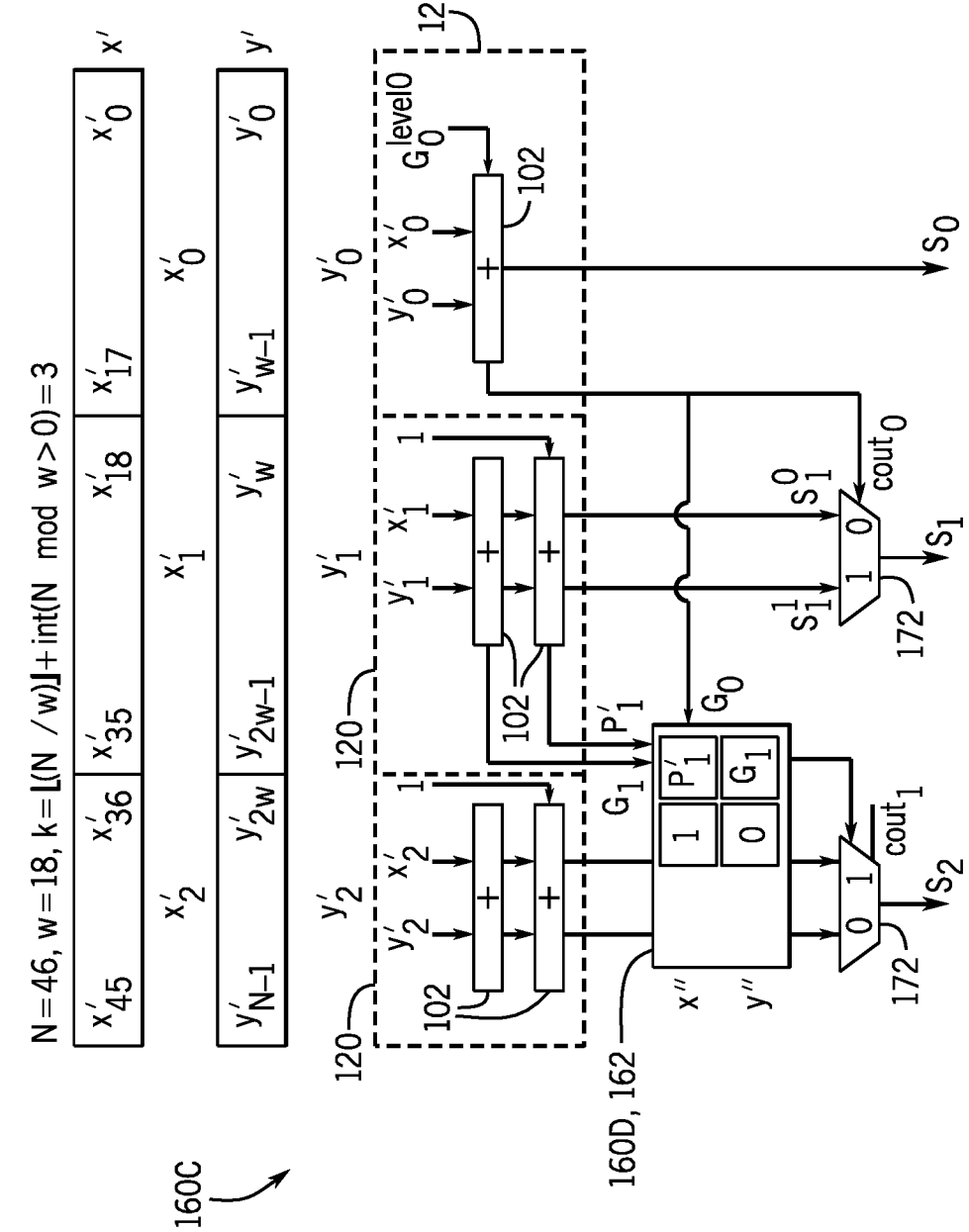
FIG. 10 is a block diagram of a second mid-level restructured adder having a recursive restructured adder implementation of a prefix network, in accordance with an embodiment.

As such, the first mid-level restructured adder 160B may include a second mid-level restructured adder 160C, having a precision of 46-bits, implemented as the prefix network 162 of the first mid-level restructured adder 160B. As illustrated in FIG. 10, the second mid-level restructured adder 160C may receive the first mid-level input string X' and the first mid-level second input string Y' as input operands. The second mid-level restructured adder 160C may segment each of the 46-bit operands into 3, 18-bit operand segments. Accordingly, the second mid-level restructured adder 160C may route a second mid-level first input string (X"), which may be formed by alternating 1s between the propagate' signal values generated by the decoders 120 implemented to sum the first mid-level first input string (X') and the first mid-level second input string (Y') with a carry-in of 1, and a second mid-level second input string (Y"), which may be formed by alternating 0s between the generate signal values generated by the decoders 120 implemented to sum the first mid-level first input string (X') and the first mid-level second input string (Y'). To that end, the prefix network 162 of the second mid-level restructured adder 160C may receive two, 2-bit input strings (e.g., X" and Y").

In some embodiments, the recursive implementation of the restructured adder 160 as a prefix network 162 terminates when the precision of the prefix network 162 is less than the bit-width of an operand segment. For example, the recursive implementation may terminate when the bit width of the respective first input string and the respective second input string for a level of the recursive implementation of the restructured adder 160 is less than the bit-width of the operand segment. Accordingly, a final-level restructured adder 160D implemented to receive the two 2-bit input strings (X" and Y"), as illustrated in FIG. 11, may be the base (e.g., root) of the recursive implementation of the restructured adder 160.

Figure 11:
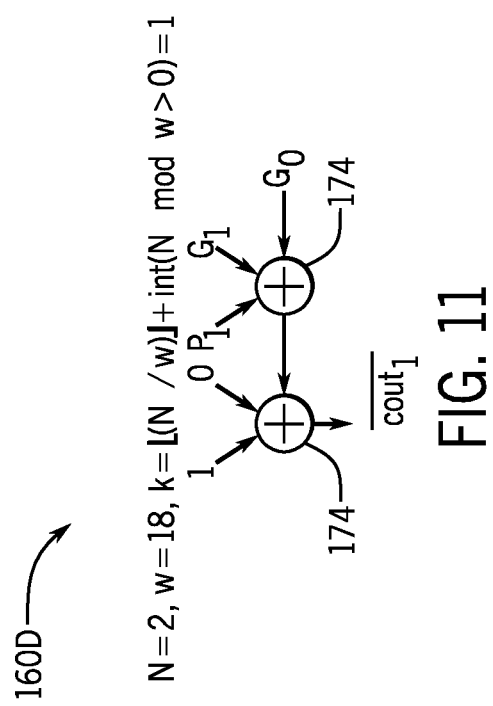
FIG. 11 is a block diagram of a final-level restructured adder having a recursive restructured adder implementation of a prefix network, in accordance with an embodiment.

Turning to FIG. 11, in some embodiments, the final-level restructured adder 160D may be implemented as a ripple-carry adder. Accordingly, the final-level restructured adder 160D may include a first binary adder 174 implemented to receive the first bit of the second mid-level second input string (X"), the first bit of the second mid-level second input string (Y"), and a carry-in bit ($G_0$). Further, the first binary adder 174 may produce a carry-out bit, which is received as a carry-in value to a second binary adder 174 of the final-level restructured adder 160D. Along with the carry-out produced by the first binary adder 174, the second binary adder 174 of the final-level restructured adder 160D may receive the second bit of the second mid-level second input string (X") and the second bit of the second mid-level second input string (Y") as inputs to produce a carry-out bit.

Since the final-level restructured adder 160D may be the base of the recursive implementation of the restructured adder 160, the carry-out bit produced by the second binary adder 174 may select a sum and/or may carry into a sum produced by the second mid-level restructured adder 160C. For example, because the second mid-level restructured adder 160C may use the final-level restructured adder 160D as a prefix network 162, the second mid-level restructured adder 160C may, as described with reference to FIG. 8, use the carry-out value produced by the final-level restructured adder 160D to determine a sum of pairs of operand segments. Accordingly, the first mid-level restructured adder 160B may use any sums produced by the second mid-level restructured adder 160C to determine one or more sums of pairs of operand segments in the first-mid level restructured adder 160B, and the top-level restructured adder 160A may use any sums produced by the first mid-level restructured adder 160B to determine one or more sums of pairs of operand segments in the top-level restructured adder 160A.

Figure 12:
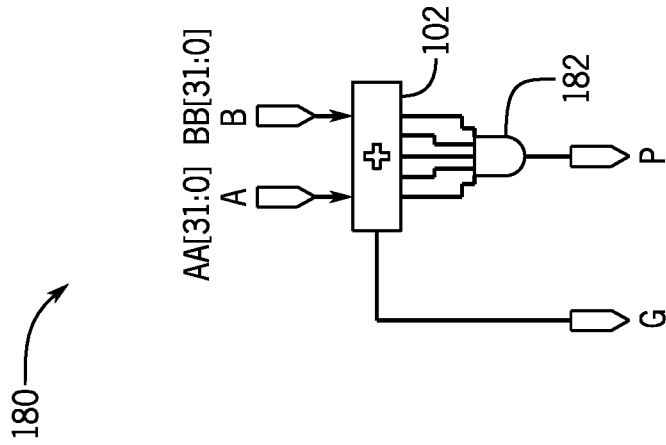
FIG. 12 is a block diagram of a restructured decoder, in accordance with an embodiment.

In addition to or in the alternative to implementing the restructured adder 160 with a recursive implementation of the restructured adder 160 as the prefix network 162, in some embodiments, the restructured adder 160 may be implemented with an architecture to generate the propagate and/or propagate' signal using an AND gate suitable to determine the logical AND of a set of two or more bits. Accordingly, as illustrated in FIG. 12, a restructured decoder 180 may generate a propagate signal with a multi-input AND gate 182 implemented to receive the sum of a pair of operand segments from a sub-adder 102.

In some embodiments, as described with reference to FIG. 4, the propagate signal may be defined as logical AND of the complement of the generate signal and the sum of a first operand segment and a second operand segment with a carry-in value of 1. In other embodiments, the propagate signal may be re-expressed as the logical AND of each of the bits of the sum of the pair of operand segments. Accordingly, for a sum (S) generated by the addition of a first operand segment (e.g., AA[31:0]) and a second operand segment (e.g., BB[31:0]), the propagate signal may be defined as $S_0$ & $S_1$ & ... & $S_{N-1}$, where $S = \{S_{N-1}, \ldots, S_0\}$. To that end, the multi-input AND gate 182 may receive the sum of the pair of operand segments from a sub-adder 102 and generate the propagate signal, as defined by $S_0$ & $S_1$ & & $S_{N-1}$.

Figure 13:
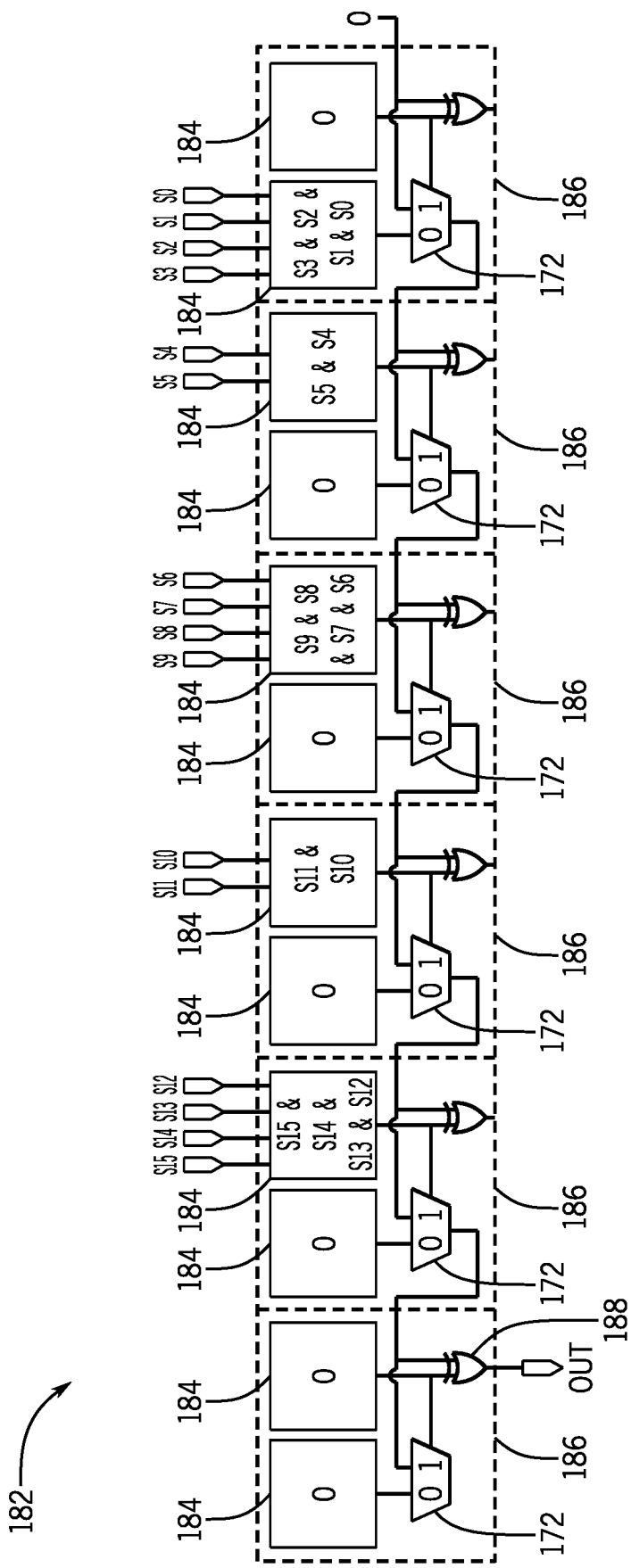
FIG. 13 is a block diagram of a multi-input adder of the restructured decoder of FIG. 12, in accordance with an embodiment.

As illustrated in FIG. 13, to determine the logical AND of each of the bits of the sum of the operand segments, the multi-input AND gate 182 may include one or more look up tables 184 (LUTs). More specifically, in some embodiments, the multi-input AND gate 182 may include one or more arithmetic cells 186 (e.g., logic cells and/or logic blocks), which may each include arithmetic logic structures, such as one or more LUTs 184, a mux, and/or the like. Accordingly, a least-significant arithmetic cell 186 may include a mux 172 implemented to receive 0 as a first input value and the result of the logical AND of a first subset of bits (e.g., S0, S1, S2, and S3) from the sum of the pair of operands as a second input value and may select between the first input value and the second input value based on the value of a select signal. In some embodiments, the first input value and/or the second input value to the mux 172 may each route from a respective LUT 184 implemented to produce the respective value. In the case of the second input value, for example, a LUT 184 may receive first subset of bits (e.g., S0, S1, S2, and S3) and may determine a value resulting from the logical AND of each of the bits (e.g., S0&S1&S2&S3). Further, in some embodiments, the select signal provided at the mux 172 of the least significant arithmetic cell 186 may be implemented to cause the mux 172 to select the value resulting from the logical AND of each of the bits of the sum of the pair of operand segments (e.g., the second input value), which in the illustrated embodiment, corresponds to the value input to the mux 172 corresponding to a select signal with the value of 0. In other embodiments, however, the value resulting from the logical AND of each of the bits of the sum of the pair of operand segments may correspond to a select signal with a value of 1 and/or any other suitable select signal value. In any case, the select signal provided at the mux 172 of the least significant arithmetic cell 186 may be implemented to cause the mux 172 to select the value resulting from the logical AND of each of the bits of the sum of the pair of operand segments.

In some embodiments, the output of the mux 172 of the least-significant arithmetic cell 186 may feed into an input of a mux 172 in a second arithmetic cell 186 (e.g., a subsequent arithmetic cell 186), which may correspond to a select signal value of 1. The second mux 172 may additionally receive a 0 as an input, which may correspond to a select signal value of 0. Further, the second arithmetic cell 186 may receive a second subset of bits (e.g., S4 and S5) from the sum of the pair of operands as inputs to a LUT 184 implemented to determine the logical AND of the second subset of bits (e.g., S4&S5) and to route the result to the mux 172 as a select signal. Accordingly, if the result of the logical AND of the first subset of bits (e.g., S0&S1&S2&S3) is 1, the mux 172 of the second arithmetic cell 186 may receive an input with a value of 0 and an input with a value of 1 as inputs, and if the result of the logical AND of the first subset of bits is 0, the mux 172 of the second arithmetic cell 186 may receive two inputs, each with a value of 0. In either case, the mux 172 may select between the inputs based on the second subset of bits. To that end, if the result of the logical AND of the second subset of bits (e.g., S4&S5) is 1, the mux 172 may output the result of the logical AND of the first subset of bits, and if the result of the logical AND of the second subset of bits is 0, the mux 172 may output 0. More generally, in some embodiments, if each of the first subset of bits and the second subset of bits have a value of 1, the mux 172 of the second arithmetic cell 186 may output 1, and if any of the first subset of bits or the second subset of bits have a value of 0, the mux 172 of the second arithmetic cell 186 may output 0. For example, the mux 172 of the second arithmetic cell 186 may output a value corresponding to the logical AND of each of the first subset of bits and the second subset of bits (e.g., S0&S1&S2&S3&S4&S5).

Accordingly, the output of the mux 172 of the second arithmetic cell 186 may route to an input of a mux 172 in a third arithmetic cell 186. The mux 172 of the third arithmetic cell 186 may receive a value of 0, which may correspond to a select signal value of 0, as an input and the output of the preceding mux 172 (e.g., the mux 172 of the second arithmetic cell 186), which may correspond to a select signal value of 1, as an additional input. The mux 172 of the third arithmetic cell 186 may select between the two inputs based on a select signal routed from a LUT 184 implemented to determine the logical AND of a third subset of bits of the sum of the pair of operands (e.g., S6, S7, S8, and S9). As such, the mux 172 may output 1 if each of the first subset of bits, the second subset of bits, and the third subset of bits have a value of 1 and may output 0 if any of the first subset of bits, the second subset of bits, or the third subset of bits have a value of 0. That is, as described above, the mux 172 of the third arithmetic cell 186 may output a value corresponding to the logical AND of each of the first subset of bits, the second subset of bits, and the third subset of bits (e.g., S0&S1&S2&S3&S4&S5&S6&S7&S8&S9).

Further, the output of the mux 172 of the third arithmetic cell 186 may route to an input of a mux 172 in a fourth arithmetic cell 186. The mux 172 of the fourth arithmetic cell 186 may additionally receive a value of 0 as an input and may select between the output of the preceding mux 172 (e.g., the mux 172 of the third arithmetic cell 186), which may correspond to a select signal value of 1, and 0, which may correspond to a select signal value of 0, based on a select signal routed from a LUT 184 implemented to determine the logical AND of a fourth subset of bits of the sum of the pair of operands (e.g., S10 and S11). As such, the mux 172 may output 1 if each of the first subset of bits, the second subset of bits, the third subset of bits, and the fourth subset of bits have a value of 1 and may output 0 if any of the first subset of bits, the second subset of bits, the third subset of bits, or the fourth subset of bits have a value of 0. That is, as described above, the mux 172 of the fourth arithmetic cell 186 may output a value corresponding to the logical AND of each of the first subset of bits, the second subset of bits, the third subset of bits, and the fourth subset of bits (e.g., S0&S1&S2&S3&S4&S5&S6&S7&S8&S9&S10&S11).

Further, the output of the mux 172 of the fourth arithmetic cell 186 may route to an input of a mux 172 in a fifth arithmetic cell 186. The mux 172 of the fifth arithmetic cell 186 may additionally receive a value of 0 as an input and may select between the output of the preceding mux 172 (e.g., the mux 172 of the fourth arithmetic cell 186), which may correspond to a select signal value of 1, and 0, which may correspond to a select signal value of 0, based on a select signal routed from a LUT 184 implemented to determine the logical AND of a fifth subset of bits of the sum of the pair of operands (e.g., S12, S13, S14, and S15). As such, the mux 172 may output 1 if each of the first subset of bits, the second subset of bits, the third subset of bits, the fourth subset of bits, and the fifth subset of bits have a value of 1 and may output 0 if any of the first subset of bits, the second subset of bits, the third subset of bits, the fourth subset of bits, or the fifth subset of bits have a value of 0. That is, as described above, the mux 172 of the fourth arithmetic cell 186 may output a value corresponding to the logical AND of each of the first subset of bits, the second subset of bits, the third subset of bits, the fourth subset of bits, and the fifth subset of bits (e.g., S0&S1&S2&S3&S4&S5&S6&S7& S8& S9& S10&S11&S12&S13&S14&S15).

In some embodiments, the output of the mux 172 of the fifth arithmetic cell 186 may route to an input of an exclusive OR (XOR) gate 188 in a final arithmetic cell 186 of the multi-input AND gate 182. The XOR gate 188 may additionally receive a signal having a value of 0 as an input. Accordingly, the multi-input AND gate 182 may output a propagate signal having a value of 1 when each of the bits in the sum of the pair of operands segments have a value of 1 and may output a propagate signal having a value of 0 when any of the bits in the sum of the pair of operands segments have a value of 0. For example, the XOR gate 188 may output a propagate signal having a value of 1 when the logical AND of each of the bits of the sum of the pair of operands segments produces a value of 1, which may be received from the output of the mux 172 of the fifth arithmetic cell 186. Further, in some embodiments, the propagate signal may additionally or alternatively route directly from the output of the mux 172 of the fifth arithmetic cell 186.

In some embodiments, while the logical AND gate 122 illustrated in FIG. 4 may use N+O(1) arithmetic cells 186, where N represents a number of inputs (e.g., the number of bits in an operand segment) and O(1) represents Big O notation of a constant, the multi-input AND gate 182 may use $$\left(\frac{N}{3}\right) + O(1)$$

arithmetic cells 186. Accordingly, by generating a propagate signal with a multi-input AND gate 182 and/or the restructured decoder 180, the area and/or resources (e.g., number of arithmetic cells 186) used to implement the restructured adder 160 may be reduced.

While the techniques described above reference a multi-input AND gate 182 implemented to receive 16 bits, in some embodiments, they may be extended for use as a part of any suitably sized multi-input AND gate 182. Further, while the output of a preceding mux 172 is depicted as routing to an input selected at a subsequent mux 172 in the illustrated embodiment of the multi-input AND gate 182, in some embodiments, the output of the preceding mux 172 may alternatively route to the select signal of the subsequent mux 172. In such cases, the output of the LUT 184 in the arithmetic cell 186 corresponding to the subsequent mux 172 may route to the input of the subsequent mux 172 instead of to the select signal of the subsequent mux 172. For example, the routing of the output of the preceding mux 172 and the output of the LUT 184 in the arithmetic cell 186 corresponding to the subsequent mux 172 may be interchanged. Moreover, while the multi-input AND gate 182 in the illustrated embodiment is implemented to receive a subset of four bits at a first arithmetic cell 186 and a set of two bits at a subsequent arithmetic cell 186, or six independent input bits between each pair of adjacent arithmetic cells 186, in some embodiments, each arithmetic cell 186 in the multi-input AND gate 182 may be implemented to receive any suitable number of input bits. Accordingly, examples described herein are intended to be illustrative, and not limiting.

Figure 14:
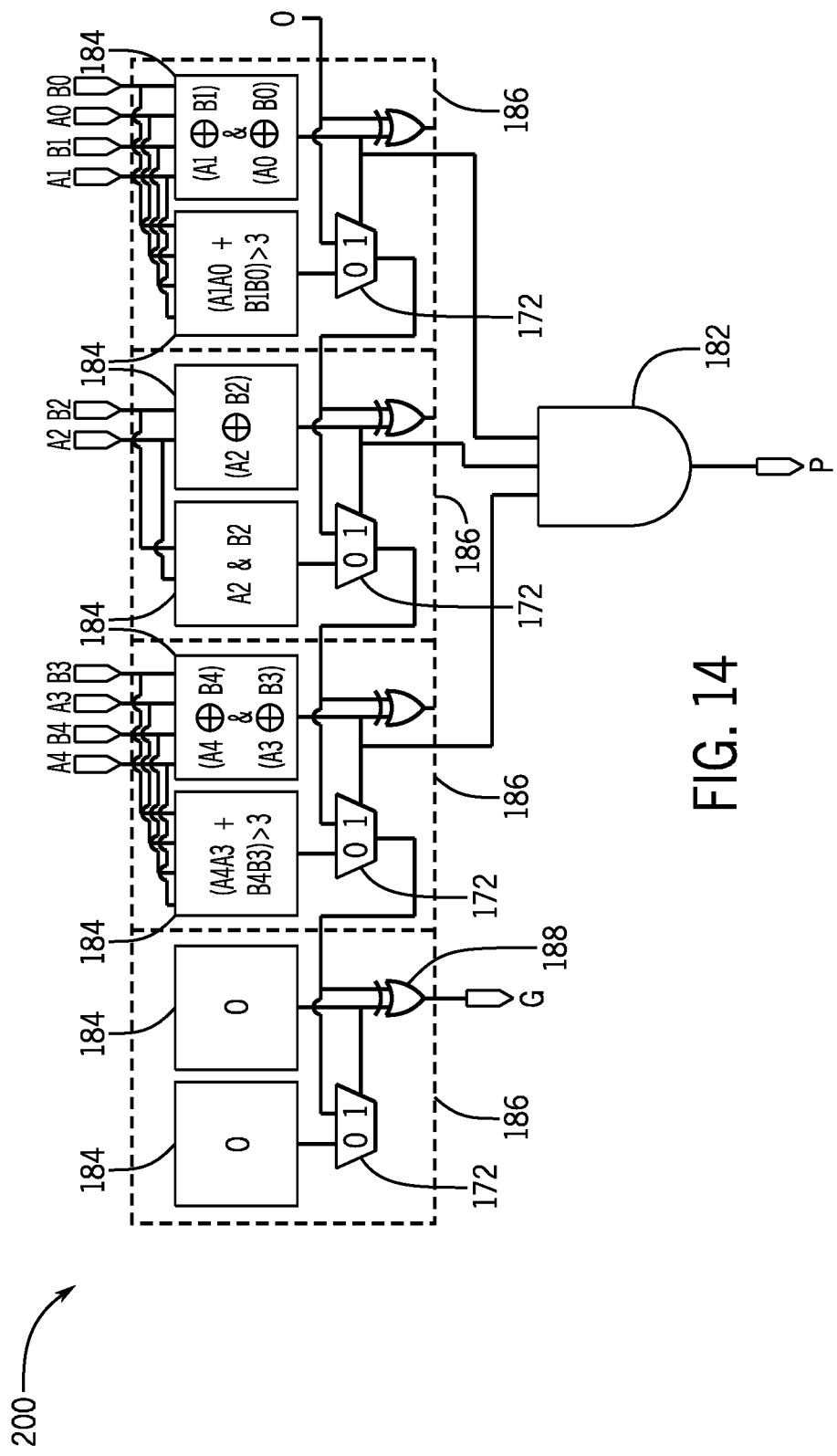
FIG. 14 is a block diagram of a restructured sub-adder, in accordance with an embodiment.

Turning now to FIG. 14, a restructured sub-adder 200 may be implemented to reduce area and/or resources (e.g., arithmetic cells 186) used to produce a generate signal and/or a propagate signal. For example, while a full adder may produce the generate signal with one logic cell (e.g., arithmetic cell 186) for each input bit, the restructured sub-adder 200 may compress the addition of a pair of operand segments to produce the generate signal using two logic cells for every three input bits.

Accordingly, in some embodiments, the restructured sub-adder 200 may receive the first two bits of each of the pair of operand segments (e.g., A1 and A0 and B1 and B0) at a least-significant (e.g., first) arithmetic cell 186 and may generate a sum bit and a carry bit based on the first two bits of each of the pair of operand segments. As such, the least-significant arithmetic cell 186 may include a first LUT 184 implemented to determine the result of the logical AND of the exclusive OR of the first bit of each of the pair of operand segments (e.g., A0⊕B0) with the exclusive OR of the second bit of each of the pair of operand segments (e.g., A1⊕B1), which may be expressed as (A1⊕B1) & (A0⊕B0), using combinatorial logic. The result of the least-significant arithmetic cell 186 may feed into a logical AND gate, such as the multi-input AND gate 182), as a first bit of the sum of the pair of operand segments and may route into a mux 172 as a select signal. In some embodiments, the mux 172 of the least-significant arithmetic cell 186 may receive a bit value of 0 as a first input corresponding to a select signal value of 1 and the result of a second LUT 184 as a second input corresponding to a select signal value of 0. The second LUT 184 may be implemented to determine whether the sum of the first two bits of each of the pair of operand segments is greater than 3, which may be expressed as ((A1A0+B1B0)>3). Accordingly, the output of the mux 172, as selected by the select signal routed form the first LUT 184, may represent a carry-out value resulting from the sum of the first two bits of each of the pair of operand segments and may carry-in to a subsequent arithmetic cell 186.

More specifically, in some embodiments, the output of the mux 172 of the least-significant arithmetic cell 186 may route into an input of a mux 172 in a subsequent (e.g., adjacent) arithmetic cell 186 corresponding to a select signal value of 1. The mux 172 of the subsequent arithmetic cell 186 may additionally receive an input corresponding to a select signal value of 0 from the output of a LUT 184 implemented to determine the logical AND of the third bit of each of the pair of operand segments (e.g., A2 and B3), which may be expressed as (A2 & B2), using combinatorial logic. Further, the mux 172 of the subsequent arithmetic cell 186 may select between the inputs based on a value of a select signal routed from the output of a LUT 184 implemented to determine the exclusive or of the third bit of each of the pair of operand segments which may be expressed as (A2⊕B2). Accordingly, the mux 172 of the subsequent arithmetic cell 186 may select a suitable carry-out bit resulting from the sum of the third bit of each of the pair of operand segments. Further, the result of the exclusive OR of the third bit of each of the pair of operand segments may route from the subsequent arithmetic cell 186 to an AND gate, such as the multi-input AND gate 182, as a sum bit resulting from the addition of the third bit of each of the pair of operand segments.

As described above with reference to the carry-out output by the mux 172 of the least-significant arithmetic cell 186, the output of the mux 172 of the subsequent arithmetic cell 186 may feed into an additional subsequent arithmetic cell 186 as an input corresponding to a select signal value of 1 at a mux 172 of the additional subsequent arithmetic cell 186. The mux 172 of the additional subsequent arithmetic cell 186 may further receive the output of a LUT 184 implemented to determine whether the sum of the last (e.g., most significant) two bits of each of the pair of operand segments (e.g., A4 and A3 and B4 and B3) is greater than 3, which may be expressed as ((A4A3+B4B3)>3), as an input corresponding to a select signal value of 0. The output of a LUT 184 implemented to determine the result of the logical AND of the exclusive OR of the most significant bit of each of the pair of operand segments (e.g., A4⊕B4) with the exclusive OR of the bit preceding the most significant bit of each of the pair of operand segments (e.g., A3⊕B3), which may be expressed as (A4⊕B4) & (A3⊕B3) may route in as the select signal of the mux 172 of the additional subsequent arithmetic cell 186 and out to a logical AND gate, such as the multi-input AND gate 182, as a sum bit of the most significant two bits of each of the pair of operand segments.

Accordingly, the output of the mux 172 of the subsequent arithmetic cell 186 may represent the carry-out of the addition of the most significant two bits of each of the pair of operand segments. Moreover, because the output of the mux 172 of the additional subsequent arithmetic cell 186 is the final carry-out of the addition of the pair of operand segments, the output represents the carry-out of the overall sum of the pair of operand segments, which in some embodiments, corresponds to the generate signal. Additionally or alternatively, the restructured sub-adder 200 may produce the generate signal by feeding the output of the mux 172 of the additional subsequent arithmetic cell 186 into an exclusive OR gate with an additional input of 0 so that the value of the generate signal is 1 when the output of the mux 172 of the additional subsequent arithmetic cell 186 is 1.

In some embodiments, as discussed above, by compressing the summation of operand segments used to produce the generate signal and/or the propagate signal, the integrated circuit device 12 may use fewer logic cells (e.g., arithmetic cells 186). Accordingly, the area and/or power used by the restructured adder 160 may be reduced. More specifically, in some embodiments, while the total area used to produce the generate signal and the propagate signal without compression may be represented as 2N, where N indicates a number of inputs (e.g., the number of bits in an operand segment), the total area used to produce the generate signal and the propagate signal with compression may be represented as 8/9N. Further, while the restructured sub-adder 200 is depicted as compressing the addition of a pair of operand segments to produce the generate signal using two logic cells for every three input bits, in some embodiments, the restructured sub-adder 200 may use one logic cell for every two input bits using the techniques described herein.

While embodiments described herein may be described as having operand segment precisions determined based in part on a precision of the integrated circuit device 12, in some embodiments, the operand segment precisions used at the restructured adder 160 may be determined based in part on precisions that may fit naturally into the integrated circuit device, which may depend on the area of the integrated circuit device 12 at which the restructured adder 160 is implemented. For example, an operand segment may include 13 bits, 19 bits, and/or the like to enable easier placement on the integrated circuit device 12 and/or more efficient generation and/or construction of the restructured adder 160. Further, in some embodiments, operand segments received at different decoders of the restructured adder 160 may include a different number of bits. Accordingly, the embodiments described herein are intended to be illustrative, and not limiting.

Figure 15:
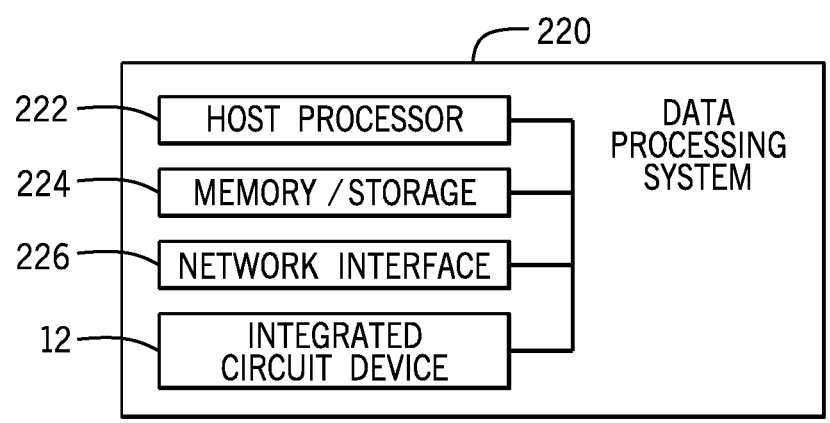
FIG. 15 is a block diagram of a data processing system, in accordance with an embodiment.

The integrated circuit device 12 may be, or may be a component of, a data processing system. For example, the integrated circuit device 12 may be a component of a data processing system 220, shown in FIG. 15. The data processing system 220 may include a host processor 222, memory and/or storage circuitry 224, and a network interface 226. The data processing system 220 may include more or fewer components (e.g., electronic display, user interface structures, application specific integrated circuits (ASICs)). The host processor 222 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 220 (e.g., to perform encryption, decryption, machine learning, video processing, voice recognition, image recognition, data compression, database search ranking, bioinformatics, network security pattern identification, spatial navigation, or the like). The memory and/or storage circuitry 224 may include random access memory (RAM), read-only memory (ROM), one or more hard drives, flash memory, or the like. The memory and/or storage circuitry 224 may hold data to be processed by the data processing system 220. In some cases, the memory and/or storage circuitry 224 may also store configuration programs (bitstreams) for programming the integrated circuit device 12. The network interface 226 may allow the data processing system 220 to communicate with other electronic devices. The data processing system 220 may include several different packages or may be contained within a single package on a single package substrate.

In one example, the data processing system 220 may be part of a data center that processes a variety of different requests. For instance, the data processing system 220 may receive a data processing request via the network interface 226 to perform encryption, decryption, machine learning, video processing, voice recognition, image recognition, data compression, database search ranking, bioinformatics, network security pattern identification, spatial navigation, or some other specialized task. The host processor 222 may cause the programmable logic fabric of the integrated circuit device 12 to be programmed with an adder suitable to implement a requested task. For instance, the host processor 222 may instruct that a configuration data (bitstream) stored on the memory and/or storage circuitry 224 to be programmed into the programmable logic fabric of the integrated circuit device 12. The configuration data (bitstream) may represent a circuit design for an adder, such as a restructured adder 160, which may be mapped to the programmable logic according to the techniques described herein, to efficiently perform and/or compute the requested task. By efficiently mapping the adder to the programmable logic and/or efficiently implementing the adder in circuitry, such as implementing the adder on an ASIC device, which may reduce routing and area resources used to perform the requested task that may involve large arithmetic operations, the integrated circuit device 12 may rapidly assist the data processing system 220 in performing the requested task.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Accordingly, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. Adder circuitry on an integrated circuit device, the adder circuitry comprising:
   first input circuitry configured to receive a first input having a first set of bits;
   second input circuitry configured to receive a second input having a second set of bits;
   a first decoder coupled to the first input circuitry and to the second input circuitry, wherein the first decoder is configured to receive a first subset of the first set of bits and a first subset of the second set of bits and to determine a generate signal and a propagate signal based at least in part on the first subset of the first set of bits and the first subset of the second set of bits;
a prefix network coupled to the first decoder, wherein the prefix network is configured to determine a carry out signal based at least in part on the generate signal and the propagate signal, wherein the prefix network comprises first combinatorial circuitry;
second combinatorial circuitry coupled to the prefix network, wherein the second combinatorial circuitry comprises sub-adder circuitry coupled to the first input circuitry, the second input circuitry, and the prefix network, wherein the sub-adder circuitry is configured to determine a portion of a sum of the first set of bits and the second set of bits by adding a second subset of the first set of bits, a second subset of the second set of bits, and the carry out signal; and
a delay chain coupled between the first input circuitry and the sub-adder circuitry and between the second input circuitry and the sub-adder circuitry, wherein the delay chain is configured to delay receipt of the second subset of the first set of bits and the second subset of the second set of bits at the sub-adder circuitry based in part on a latency of the prefix network.

2. The adder circuitry of claim 1, wherein the delay chain further comprises one or both of registers or memory configured to implement a first-in-first-out (FIFO) data structure.

3. The adder circuitry of claim 1, wherein the first decoder is further configured to determine the generate signal based on an additional sum of the first subset of the first set of bits and the first subset of the second set of bits.

4. The adder circuitry of claim 1, wherein the first decoder is further configured to determine a precursor to the propagate signal based in part on an additional sum of the first subset of the first set of bits and the first subset of the second set of bits with a carry-in signal, wherein the first decoder comprises an AND gate configured to receive a complement of the generate signal and the precursor to the propagate signal and to determine the propagate signal based in part on a logical AND of the complement of the generate signal and the precursor to the propagate signal.

5. The adder circuitry of claim 1, wherein the first decoder comprises a multi-input AND gate, wherein the multi-input AND gate is configured to determine the propagate signal based in part on a logical AND of each of a third set of bits of a second sum of the first subset of the first subset set of bits and the first subset of the second set of bits.

6. The adder circuitry of claim 1, wherein the first decoder is further configured to determine one or both of the generate signal or the propagate signal based at least in part on a compression of a second sum of the first subset of the first set of bits and the first subset of the second set of bits.

7. The adder circuitry of claim 1, wherein a topology of the prefix network comprises a Kogge-Stone topology, a Brent-Kung topology, a Sklansky topology, or a combination thereof.

8. The adder circuitry of claim 1, wherein the prefix network is further configured to determine the carry out signal based in part on an additional sum of a first input string and a second input string, wherein the first input string comprises an arithmetic one alternated with the propagate signal, wherein the second input string comprises an arithmetic zero alternated with the generate signal.

9. The adder circuitry of claim 1, wherein the prefix network is further configured to recursively determine the carry out signal, wherein the prefix network comprises:
a second decoder configured to receive a first subset of the generate signal and a first subset of the propagate signal and to determine an additional generate signal and an additional propagate signal based at least in part on the first subset of the generate signal and the first subset of the propagate signal;
an additional prefix network coupled to the second decoder, wherein the additional prefix network is configured to determine an additional carry out signal based at least in part on the additional generate signal and the additional propagate signal, wherein the additional prefix network comprises third combinatorial circuitry; and
fourth combinatorial circuitry coupled to the additional prefix network, wherein the fourth combinatorial circuitry is configured to determine the carry out signal based at least in part on the additional carry out signal.

10. The adder circuitry of claim 1, wherein the prefix network further comprises a ripple carry adder comprising a first ripple carry adder and a second ripple carry adder, wherein a precision of the ripple carry adder is higher than or equal to an additional respective precision of each of the first ripple carry adder and the second ripple carry adder.

11. The adder circuitry of claim 1, wherein the integrated circuit device comprises a field-programmable gate array.

12. Adder circuitry on an integrated circuit device, the adder circuitry comprising:
first input circuitry configured to receive a first input having a first set of bits;
second input circuitry configured to receive a second input having a second set of bits;
a first decoder coupled to the first input circuitry and to the second input circuitry, wherein:
the first decoder is configured to:
receive a first subset of the first set of bits and a first subset of the second set of bits;
determine a precursor to a propagate signal based in part on a sum of the first subset of the first set of bits and the first subset of the second set of bits with a carry-in signal; and
determine a generate signal based at least in part on the first subset of the first set of bits and the first subset of the second set of bits;
the first decoder comprises an AND gate configured to:
receive a complement of the generate signal and the precursor to the propagate signal; and
determine the propagate signal based in part on a logical AND of the complement of the generate signal and the precursor to the propagate signal;
a prefix network coupled to the first decoder, wherein the prefix network is configured to determine a carry out signal based at least in part on the generate signal and the propagate signal, wherein the prefix network comprises first combinatorial circuitry; and
second combinatorial circuitry coupled to the prefix network, wherein the second combinatorial circuitry is configured to determine a portion of a sum of the first set of bits and the second set of bits based at least in part on the carry out signal.

13. The adder circuitry of claim 12, wherein the adder circuitry is implemented at least partially using programmable logic of the integrated circuit device.

14. The adder circuitry of claim 12, wherein:
the second combinatorial circuitry further comprises sub-adder circuitry configured to add a second subset of the first set of bits and a second subset of the second set of bits; and
the adder circuitry further comprises a delay chain configured to delay receipt of the second subset of the first set of bits and the second subset of the second set of bits at the sub-adder circuitry.

15. The adder circuitry of claim 12, further comprising a second decoder coupled to the first input circuitry and to the second input circuitry and configured to generate an additional generate signal based at least in part on a second subset of the first set of bits and a second subset of the second set of bits, wherein the second combinatorial circuitry comprises sub-adder circuitry coupled to the second decoder and the prefix network and configured to add the additional generate signal and the carry out signal to determine the portion of the sum of the first set of bits and the second set of bits.

16. The adder circuitry of claim 12, comprising a second decoder coupled to the first input circuitry and to the second input circuitry and configured to generate an additional generate signal based at least in part on a second subset of the first set of bits and a second subset of the second set of bits, wherein the second combinatorial circuitry comprises a multiplexer coupled to the second decoder and the prefix network, wherein the multiplexer is configured to:
receive, from the second decoder, the additional generate signal and an additional sum of the second subset of the first set of bits, the second subset of the second set of bits, and a carry in signal; and
select, based in part on the carry out signal, the portion of the sum of the first set of bits and the second set of bits as one of the additional generate signal or the additional sum.

17. Adder circuitry on an integrated circuit device, the adder circuitry comprising:
first input circuitry configured to receive a first input having a first set of bits;
second input circuitry configured to receive a second input having a second set of bits;
a first decoder coupled to the first input circuitry and to the second input circuitry, wherein the first decoder is configured to receive a first subset of the first set of bits and a first subset of the second set of bits and to determine a generate signal and a propagate signal based at least in part on the first subset of the first set of bits and the first subset of the second set of bits;
a prefix network coupled to the first decoder, wherein the prefix network is configured to recursively determine a carry out signal based at least in part on the generate signal and the propagate signal, wherein the prefix network comprises:
first combinatorial circuitry;
a second decoder configured to receive a first subset of the generate signal and a first subset of the propagate signal and to determine an additional generate signal and an additional propagate signal based at least in part on the first subset of the generate signal and the first subset of the propagate signal;
an additional prefix network coupled to the second decoder, wherein the additional prefix network is configured to determine an additional carry out signal based at least in part on the additional generate signal and the additional propagate signal, wherein the additional prefix network comprises second combinatorial circuitry; and
third combinatorial circuitry coupled to the additional prefix network, wherein the third combinatorial circuitry is configured to determine the carry out signal based at least in part on the additional carry out signal; and
fourth combinatorial circuitry coupled to the prefix network, wherein the fourth combinatorial circuitry is configured to determine a portion of a sum of the first set of bits and the second set of bits based at least in part on the carry out signal.

18. The adder circuitry of claim 17, wherein the adder circuitry is implemented at least partially using programmable logic of the integrated circuit device.

19. The adder circuitry of claim 17, wherein:
the fourth combinatorial circuitry further comprises sub-adder circuitry configured to add a second subset of the first set of bits and a second subset of the second set of bits; and
the adder circuitry further comprises a delay chain configured to delay receipt of the second subset of the first set of bits and the second subset of the second set of bits at the sub-adder circuitry.

20. The adder circuitry of claim 17, wherein the additional prefix network further comprises a third prefix network.

* * * * *